United States Patent
Itakura

(10) Patent No.: US 7,530,006 B2
(45) Date of Patent: May 5, 2009

(54) DATA RECORDING AND REPRODUCING DEVICE AND METHOD UTILIZING ITERATIVE DECODING TECHNIQUE

(75) Inventor: Akihiro Itakura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 636 days.

(21) Appl. No.: 11/041,529

(22) Filed: Jan. 25, 2005

(65) Prior Publication Data

US 2005/0152056 A1    Jul. 14, 2005

Related U.S. Application Data

(63) Continuation of application No. PCT/JP03/01553, filed on Feb. 14, 2003.

(51) Int. Cl.
  *G11C 29/00* (2006.01)
(52) U.S. Cl. .................................. 714/770; 714/756
(58) Field of Classification Search ............. 714/770, 714/756
  See application file for complete search history.

(56) References Cited

U.S. PATENT DOCUMENTS

| | | | |
|---|---|---|---|
| 5,539,433 A * | 7/1996 | Kawai et al. | 347/13 |
| 6,425,098 B1 * | 7/2002 | Sinquin et al. | 714/699 |
| 6,996,767 B2 * | 2/2006 | Chang et al. | 714/786 |
| 2001/0025358 A1 * | 9/2001 | Eidson et al. | 714/752 |
| 2002/0162058 A1 * | 10/2002 | Sinquin et al. | 714/699 |
| 2003/0028843 A1 * | 2/2003 | Chang et al. | 714/786 |

FOREIGN PATENT DOCUMENTS

| | | |
|---|---|---|
| JP | 8-315549 | 11/1996 |
| JP | 11-242569 | 9/1999 |
| JP | 2002-319869 | 10/2002 |
| JP | 2002-358654 | 12/2002 |
| JP | 2003-6993 | 1/2003 |
| JP | 2003-223761 | 8/2003 |

OTHER PUBLICATIONS

Turbo Codes For PR4: Parallel Versus Serial Concatenation, T. Souvignier, A. Friedmann, M. Oberg, P.H. Siegel, R.E. Swanson, and J.K. Wolf, Proc. IEEE Int. Conf. Communications, pp. 1638-1642, Jun. 1999.
Supplementary European Search Report issued in corresponding European Patent Application No. 03705157.0, on Oct. 11, 2007.

* cited by examiner

*Primary Examiner*—Mujtaba K Chaudry
(74) *Attorney, Agent, or Firm*—Fujitsu Patent Center

(57) ABSTRACT

A data recording and reproducing device with a small circuit size is provided that utilizes an iterative decoding technique to realize high-speed data reproduction from a recording medium on which data is recorded at a high density. This data recording and reproducing device records a data block having input data encoded with convolutional codes on a recording medium, reproduces the data block through a partial response channel, and decodes the data block from the reproduced signal, utilizing an iterative decoding technique by which the data block is decoded through iterative decoding using likelihood information. This data recording and reproducing device includes a dividing unit that divides the data block encoded with the convolutional codes into data sub blocks; and a recording unit that records the data sub blocks at non-adjacent locations on the recording medium.

6 Claims, 7 Drawing Sheets

DATA RECORDING AND REPRODUCING DEVICE AND METHOD UTILIZING ITERATIVE DECODING TECHNIQUE

CROSS-REFERENCE TO RELATED APPLICATION

This application is a U.S. continuation application filed under 35 USC 111(a) claiming benefit under 35 USC 120 and 365(c) of PCT International Application No. PCT/JP2003/001553 filed on Feb. 14, 2003, which is hereby incorporated herein by reference.

BACKGROUND OF THE INVENTION

The present invention generally relates to data recording and reproducing devices that utilize an iterative decoding technique, and, more particularly, to a data recording and reproducing device and method that utilize an iterative decoding technique and realize high-speed data reproduction from a recording medium on which data is recorded at a high density.

In the field of data recording and reproducing devices, there is an increasing demand for a technique of recording data on a recording medium at a higher density and a technique of transferring data between recording media at a higher speed. Where data is recorded on a recording medium at a high density and the data is reproduced from the recording medium at a high speed, however, the signal-to-noise ratio (SNR) of the signal reproduced from the recording medium is very low.

To counter this problem, a turbo encoding and decoding technique can be employed as a method for increasing the ability to detect reproduced signals with low SNRs.

The turbo encoding and decoding technique has been recognized as an encoding and decoding technique with great encoding gain, and has been drawing attention in the field of data storage as well as in the field of communication technology.

By the turbo encoding technique, two or more encoders that are connected in parallel or in a cascade fashion are employed. First, input user data are encoded by the two or more encoders connected in parallel or in a cascade fashion. The encoded data is then transmitted through a communication channel or is recorded on a recording medium.

The turbo-encoded data transmitted through a communication channel or recorded on a recording medium is decoded by decoders corresponding to the two or more encoders. Among the decoders, the decoding result of one of the decoders is used as an input signal to another one of the decoders, thereby performing iterative decoding. Through the iterative decoding, a transmission signal or a reproduced signal with a low SNR can be detected with high certainty.

In a data storage system that uses a magnetic disk or an optical disk as a recording medium, the PR (partial response) channel of the reproducing system is regarded as one of the two or more encoders, thus realizing encoding by the two or more encoders connected in a cascade fashion.

An example of the application of the turbo encoding and decoding technique to a magnetic disk device is disclosed in "Turbo Decoding FOR PR4: Parallel versus Serial concatenation, T. Souvignier, A. Friedmann, M. Oerg, P. H. Siegel, R. E. Swanson, and J. K. Wolf, Proc. IEEE Int. Conf. Communications, pp. 1638-1642, June 1999". By the technique disclosed in this document, a reproduced signal with a low SNR can be accurately reproduced.

FIG. 1 is a block diagram of an optical disk data recording and reproducing device 100 that uses the conventional turbo encoding and decoding technique. In the following, the operation of the optical disk 100 is described, with reference to the accompanying drawings.

In FIG. 1, the data recording and reproducing device 100 includes a recording system 101 and a reproducing system 110. The recording system 101 includes an outer encoder 102, a MUX and puncture unit 103, an interleaver 104, and a laser driving circuit 105.

The reproducing system 110 of the data recording and reproducing device 100 includes a PR channel 111, an analog-to-digital (A/D) converter 117, an iterative decoder 118, and a controller 119. The PR channel 111 includes an optical disk 112, an amplifier 113, an AGC (Auto Gain Controller) 114, a low pass filter 115, and a waveform equalizer 116.

First, the operation of each component of the recording system 101 of the data recording and reproducing device 100 is described.

The outer encoder 102 of the recording system 101 generates and outputs a parity bit stream 121 (pk) corresponding to user data 120 (uk) that is input to the data recording and reproducing device 100 and is to be recorded.

The MUX and puncture unit 103 combines the user data 120 (uk) and the parity bit stream 121 (pk), which is generated from the outer encoder 102, in accordance with predetermined rules. The combined data bit stream is then thinned out (a puncture function) in accordance with predetermined rules, thereby generating an encoded data bit stream 122 (ai).

The interleaver 104 rearranges the order in the encoded data bit stream 122 (ai), which is output from the MUX and puncture unit 103, thereby generating an interleaved encoded data bit stream 123 (ci).

The laser driving circuit 105 controls the quantity of laser emission, based on the interleaved encoded data bit stream 123 (ci) output from the interleaver 104. The laser driving circuit 105 then records the interleaved encoded data bit stream 123 (ci) on the optical disk 112.

Next, the operation of each component of the reproducing system 110 of the data recording and reproducing device 100 is described.

A reproduced signal 130 (yi) that is reproduced from the optical disk 112 with an optical head is subjected to waveform rectification through the amplifier 113, the AGC 114, the low pass filter 115, and the waveform equalizer 116.

In a case where data is recorded at such a high recording density as to cause intersymbol interference, the waveform of the reproduced signal 130 (yi) from the optical disk 112 can be equalized to a PR waveform (a partial response waveform) at the output end of the PR channel 111. In other words, PR channel encoding can be considered to be complete at the output end of the waveform equalizer 116.

Accordingly, encoding by two or more encoders that are connected in a cascade fashion is realized by the actual encoding functions of the outer encoder 102 of the recording system 101 and the PR channel 111. As a result, a turbo encoder is formed.

The iterative decoder 118 of the reproducing system 110 includes a decoder that corresponds to the outer encoder 102 of the recording system 101 and the PR channel 111 of the reproducing system 110. The iterative decoder 118 may have a structure shown in FIG. 2.

Next, the operation of the iterative decoder 118 of the reproducing system 110 is described. FIG. 2 shows an example structure of the iterative decoder 118 of the reproducing system 110.

The iterative decoder 118 includes a PR channel decoder 201, a subtractor 202, a deinterleaver 203, a DEMUX and depuncture unit 204, an outer code decoder 205, a MUX and puncture unit 206, a subtractor 207, an interleaver 208, and a hard decision unit 209.

So as to perform turbo decoding, the iterative decoder 118 utilizes the MAP (Maximum A Posteriori) technique or the like. The PR channel decoder 201 of the iterative decoder 118 corresponds to the actual encoding function of the PR channel 111, and performs APP (A Posteriori Probability) decoding.

This iterative decoding is described below in detail.

The PR channel decoder 201 calculates likelihood information L(ci) from the reproduced signal 130 (yi), and then outputs the likelihood information L(ci). The subtractor 202 subtracts priori information La(ci) 220 from the likelihood information L(ci) 211, so as to obtain outer likelihood information Le(ci) 212. Here, the priori information La(ci) 220 is obtained based on the output of the outer code decoder 205, as described later. The stream of the outer likelihood information Le(ci) obtained in order is rearranged by the deinterleaver 203, and is then supplied to the DEMUX and depuncture unit 204.

The DEMUX and depuncture unit 204 divides the stream of likelihood information, which is input in order, into a stream of likelihood information La(uk) corresponding to the user data bit (uk), which is input to the recording system 101, and a stream of likelihood information La(pk) corresponding to the parity bit 121 (pk) generated by the outer encoder 102.

During the dividing, information is added (a depuncture function) in accordance with rules corresponding to the thinning (puncture) rules used at the MUX and puncture unit 103 of the recording system 101.

The outer code decoder 205 corresponds to the outer encoder 102 of the recording system 101, and performs an APP operation using the likelihood information La(uk) and the likelihood information La(pk) corresponding to the parity bit pk, so as to obtain log-likelihood ratios L(uk) and L(pk).

The stream of log-likelihood ratios L(uk) and the stream of log-likelihood ratios L(pk) output in order from the outer code decoder 205 corresponding to the outer encoder 102 are supplied to the MUX and puncture unit 206. The MUX and puncture unit 206 combines the stream of log-likelihood ratios L(uk) and the stream of log-likelihood ratios L(pk), and subtracts information from the stream of combined log-likelihood ratios in accordance with predetermined rules (a puncture function). As a result, the MUX and puncture unit 206 outputs likelihood information L(ai).

The subtractor 207 then subtracts the priori information 213 (prior to the dividing into L(uk) and L(pk)) from the above likelihood information L(ai). The priori information 213 is obtained by deinterleaving the outer likelihood information Le(ci) with the deinterleaver 203 and is to be supplied to the outer code decoder 205 corresponding to the outer encoder 102. The output of the subtractor 207 is interleaved by the interleaver 208, so as to obtain outer likelihood information La(ci).

The outer likelihood information La(ci) is supplied as the priori information 220 to the PR channel decoder 201.

The iterative decoder 118 that includes the PR channel decoder 201 and the outer code decoder 205 iteratively performs a decoding operation using the prior information exchanged between the two decoders. This operation is called "iterative decoding".

After the iterative decoding is performed a predetermined number of times, the hard decision unit 209 determines whether a detected data bit 221 (Uk) is "1" or "0", based on the log-likelihood ratio L(uk) output from the outer code decoder 205. If the log-likelihood ratio L(uk) is greater than 0, the hard decision unit 209 determines that the detected data bit Uk is "1". If the log-likelihood ratio L(uk) is equal to or smaller than 0, the hard decision unit 209 determines that the detected data bit Uk is "0". The result of this determination is then output as decoded data from the output end of the iterative decoder 118.

FIG. 3 shows an example structure of the PR channel decoder 201 that implements the MAP algorithm shown in FIG. 2. The PR channel decoder 201 includes a gamma (γ) calculator 301, an alpha (α) calculator 302, a beta (β) calculator 303, an alpha (α) memory 304, and a LLR calculator 305.

In a MAP decoding operation, the gamma (γ) calculator 301 performs branch metric calculation in accordance with the trellis chart of the received data stream. The alpha (α) calculator 302 performs forward path metric calculation (alpha calculation), and the result of this is stored in the alpha (α) memory 304. The beta (β) calculator 303 then performs backward metric calculation (beta calculation). Based on these results, likelihood information LLR is calculated.

FIGS. 4A and 4B illustrate a calculation process in a MAP decoding operation. FIG. 4A shows the normal calculating order in a conventional MAP decoding operation. The process shown in FIG. 4B is described later. A data block 401 includes data sub blocks 402, 403, 404, and 405. The alpha (α) calculator 302 sequentially performs the forward path metric calculation from the sub block 402 toward the sub block 405. Once input is performed at the last sub block 405 of the data block 405, the beta (β) calculator 303 starts the backward path metric calculation from the sub block 405 toward the sub block 402. With the calculating order shown in FIG. 4, the beta (β) calculator 303 cannot start the backward path metric calculation before the input at the sub block 405 is completed. Therefore, a memory to store the result of each calculation of α, β, and γ (the alpha (α) memory 304 in FIG. 3, for example) is required.

In a case where data is recorded on a recording medium at a higher density and the data is reproduced at a higher speed, the signal-to-noise ratio (SNR) of the signal reproduced from the recording medium becomes poorer. To counter this problem, data stored at different locations are reproduced at the same time, so that the actual transfer speed can be increased without an increase in the reproducing speed.

FIG. 5 is a block diagram of an optical disk reproducing system that utilizes a parallel processing technique and an iterative decoding technique. The optical disk reproducing system 500 of FIG. 5 that is to reproduce recorded signals from an optical disk 501 includes N of waveform equalizers 511, 512, and 513, N of A/D converters 521, 522, and 523, N of iterative decoders 531, 532, and 533, and a controller 540. The optical disk 501 is equivalent to the optical disk 112 of FIG. 1. Each of the waveform equalizers 511, 512, and 513 is equivalent to the PR channel 111 of FIG. 1. Each of the A/D converters 521, 522, and 523 is equivalent to the A/D converter 117 of FIG. 1. Each of the iterative decoders 531, 532, and 533 is equivalent to the iterative decoder 118 of FIG. 1. The controller 540 is equivalent to the controller 119 of FIG. 1.

If recorded signals are reproduced from the optical disk 501 with N of heads, the reproducing speed becomes N times higher than the reproducing speed in the case where recorded signals are reproduced from the optical disk 501 with a single head. In that case, however, it is necessary to prepare N of waveform equalizers, N of A/D converters, and N of iterative decoders that are arranged in parallel. In accordance with the iterative decoding method, the data contained at one block should be collectively processed. Therefore, all the calculation results obtained during the operation need to be stored until the processing of the data block is completed. In the case where conventional iterative decoders are arranged in parallel and parallel processing is performed, memories each having the size corresponding to each data block need to be prepared, and the number of such memories should be the same as the number of the iterative decoders.

The iterative decoding technique enables large-capacity decoding. However, even a single decoder has a large circuit size, and large-sized memories are required for storing input data and calculation results to be obtained during a data processing operation. In the case where two or more iterative decoders are employed as shown in FIG. 5, large-sized memories need to be prepared, and the number of such memories should be the same as the number of the iterative decoders. As a result, the circuit size becomes even greater.

Japanese Laid-Open Patent Application No. 8-315549 discloses a data recording device, a data reproducing device, and a data recording carrier with which data recorded on two or more recording media or information recording planes can be readily and accurately reproduced.

SUMMARY OF THE INVENTION

A general object of the present invention is to provide data recording and reproducing devices in which the above disadvantages are eliminated.

A more specific object of the present invention is to provide a data recording and reproducing device with a small circuit size that utilizes an iterative decoding technique to realize high-speed data reproduction from a recording medium on which data is recorded at a high density.

The above objects of the present invention are achieved by a data recording and reproducing device that records a data block having input data encoded with convolutional codes on a recording medium, reproduces the data block through a partial response channel, and decodes the data block from the reproduced signal, utilizing an iterative decoding technique by which the data block is decoded through iterative decoding using likelihood information. This data recording and reproducing device includes a dividing unit that divides the data block encoded with the convolutional codes into a plurality of data sub blocks; and a recording unit that records the data sub blocks at non-adjacent locations on the recording medium.

As described above, by the iterative decoding technique, one data block needs to be collectively processed. Therefore, the calculation results obtained in the middle of the operation should be stored until the processing of the data block is completed. In the case where conventional iterative decoders are arranged in parallel and parallel processing is to be performed, memories having the sizes corresponding to the data blocks to be processed need to be provided, and the number of such memories should be the same as the number of iterative decoders. In accordance with the present invention, however, an iterative decoding circuit that performs parallel processing should have only one memory that can store the data amount corresponding to the size of each block obtained by dividing one data block by N. Thus, the present invention can provide a data recording and reproducing device with a small circuit size that utilizes an iterative decoding technique to realize high-speed data reproduction.

The above and other objects and features of the present invention will become more apparent from the following description taken in conjunction with the accompanying drawings.

DESCRIPTION OF THE PREFERRED EMBODIMENTS

The following is a description of embodiments of the present invention, with reference to the accompanying drawings.

Figure 4A:
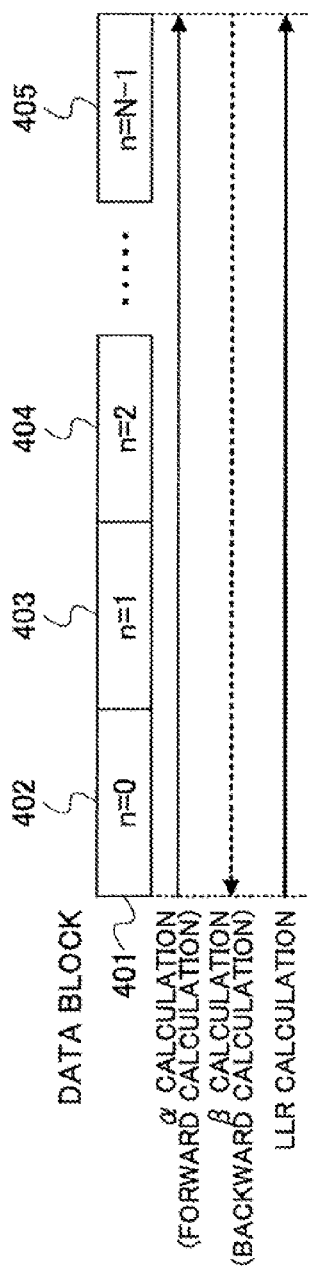
FIGS. 4A and 4B show calculating processes in MAP decoding operations.
Figure 4B:
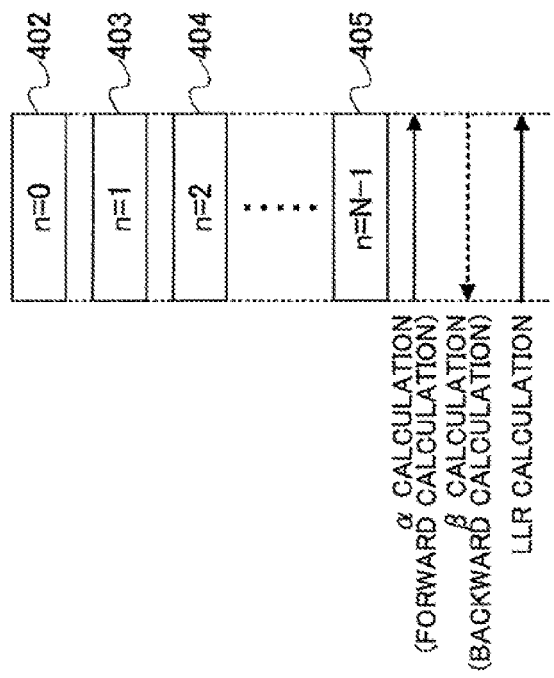
Figure 5:
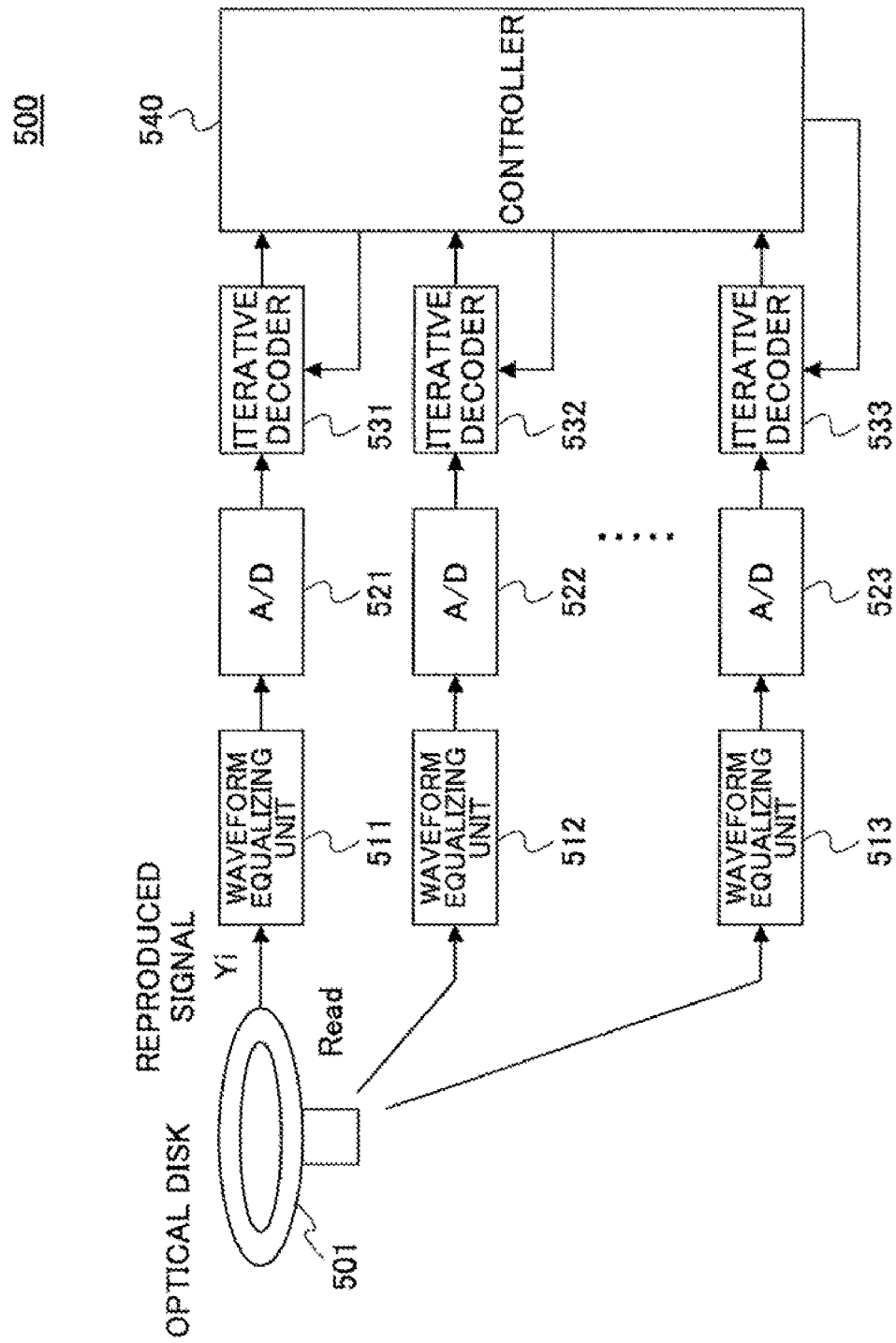
FIG. 5 is a block diagram of an optical disk reproducing system that utilizes a parallel processing and iterative decoding technique.

Referring to FIGS. 4A and 4B, the principles of the present invention are first described.

FIGS. 4A and 4B show the calculating processes in MAP decoding operations, as mentioned above. FIG. 4A shows the normal calculating order in the conventional calculating process. FIG. 4B shows the calculating process in a MAP decoding operation in accordance with the present invention.

By the principles of the present invention, data corresponding to one data block such as the data block 401 is divided into sub blocks such as the data sub blocks 402 through 405. The divided data sub blocks 402 through 405 are recorded at non-adjacent locations on the optical disk 501. When the recorded data is reproduced from the optical disk 501, the divided data sub blocks 402 through 405 are reproduced at the same time. The reproduced data sub blocks 402 through 405 are then combined and decoded.

In the case where the recorded data is reproduced from the optical disk 501 in accordance with the present invention, the data sub blocks 402 through 405 are simultaneously reproduced from the optical disk 501 as shown in FIG. 4B. The simultaneously reproduced data sub blocks 402 through 405 are then subjected in parallel to forward path metric calculation by iterative decoders. Meanwhile, when the input of the data sub block 402 through 405 is complete, backward path metric calculation is started. Here, the backward path metric calculation is performed on the respective data sub blocks 402 through 405 in parallel.

In this manner, by the calculating order shown in FIG. 4B, the backward path metric calculation is started after the read-in of the data sub blocks 402 through 405 is completed. Accordingly, the size of the memory to store the calculation result of each of $\alpha$, $\beta$, and $\gamma$ in the middle of the operation is 1/N of the size of the memory employed in a conventional iterative decoder that stores data of the same length as each one data block.

In accordance with the present invention, the divided recording data is recorded at non-adjacent locations on a disk. The "non-adjacent locations" are different tracks or different addresses on a one-sided recording disk, or different sides of a two-sided recording disk. In the case of a system that performs recording on two or more disks in parallel, the "non-adjacent locations" may be different disks or combinations of the above.

Next, a first embodiment of the present invention is described.

Figure 6:
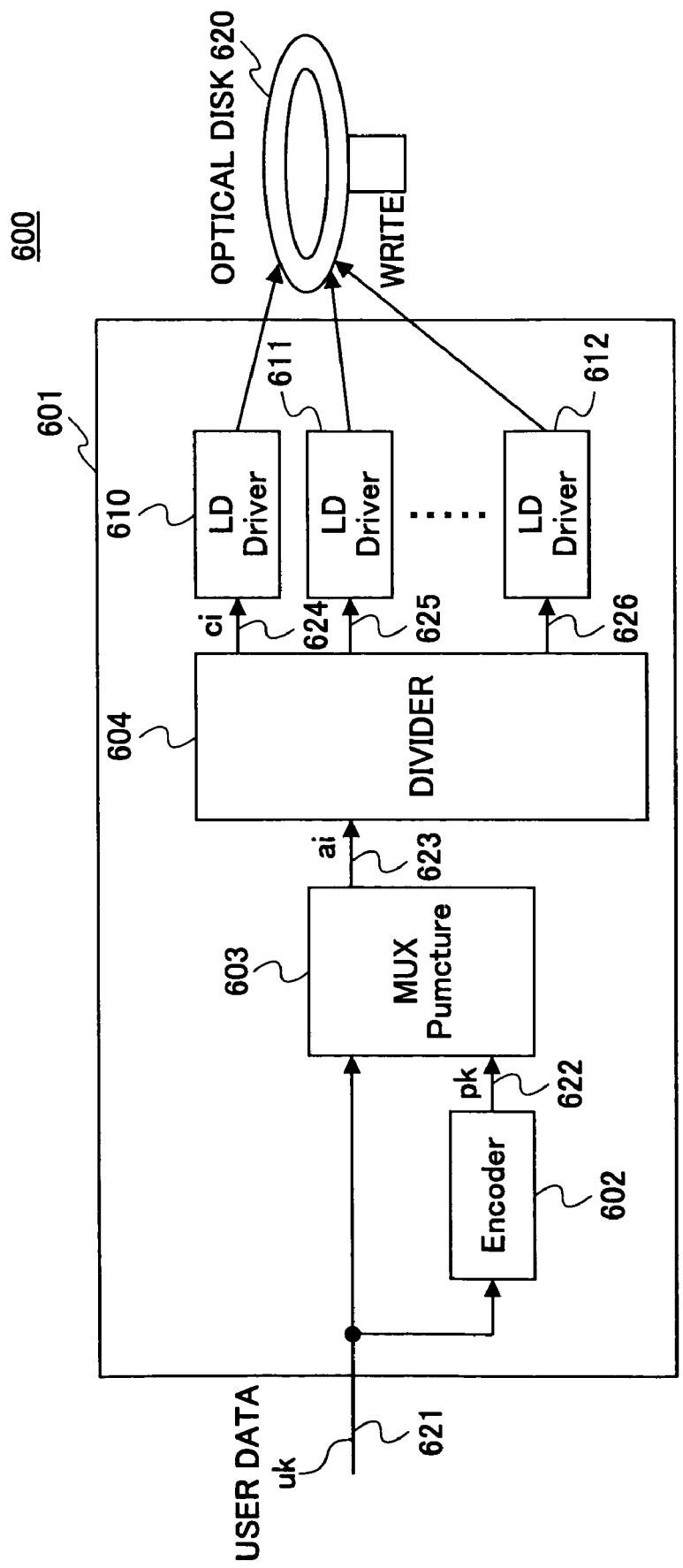
FIG. 6 is a block diagram of an optical disk recording system that utilizes a parallel processing and iterative decoding technique in accordance with the present invention.

FIG. 6 is a block diagram of an optical disk recording system that utilizes the parallel processing and iterative decoding technique of the present invention.

Figure 1:
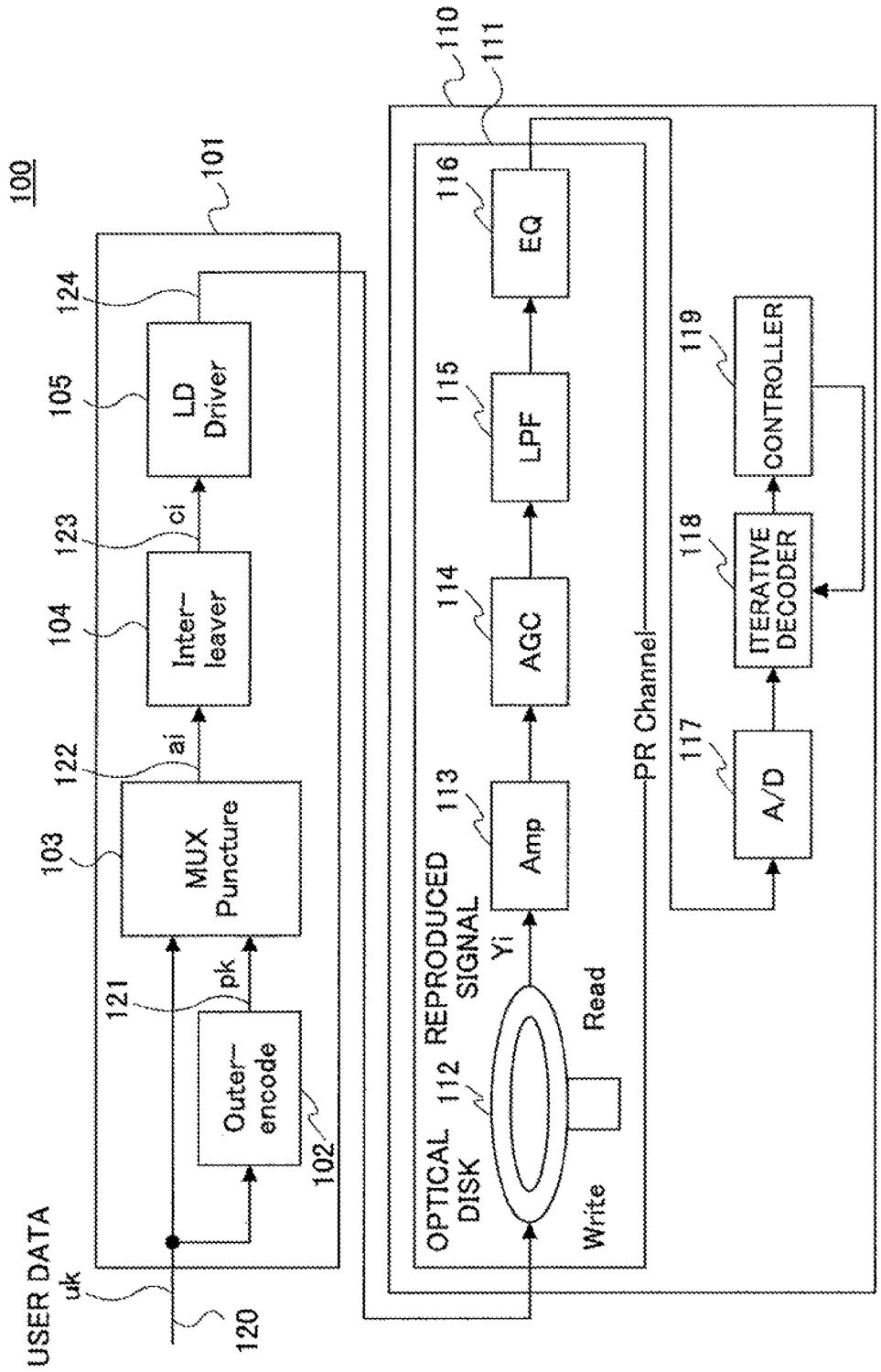
FIG. 1 is a block diagram of an optical disk data recording and reproducing device that utilizes a conventional turbo encoding and decoding technique.

The recording system 601 of a data recording and reproducing device 600 shown in FIG. 6 includes an outer encoder 602, a MUX and puncture unit 603, a divider 604, and laser driving circuits 610, 611, and 612. The divider 604 includes the function of the interleaver 104 of FIG. 1.

The outer encoder 602 generates a parity bit stream 622 (pk) corresponding to user data 621 (uk) to be recorded.

The MUX and puncture unit 603 combines the user data 621 (uk) and the parity bit stream 622 (pk) generated by the outer encoder 602 in accordance with predetermined rules, and subtracts bits from the combined bit stream in accordance with predetermined rules (a puncture function) so as to generate a data bit stream 623 (ai).

The divider 604 divides the data block containing the combined and punctured data ai, into data sub blocks as shown in FIG. 4B. The divider 604 should preferably have an interleaving function to rearrange the order in the data bit stream ai. The interleaving function is not only to rearrange the order of the bits, but also to change the locations of the bits in accordance with predetermined rules. Through the above procedures, data bit streams (ci) 624, 625, and 626 of the data sub blocks are generated.

Based on the respective data bit streams (ci) 624, 625, and 626 of the data sub blocks, the laser driving circuits 610, 611, and 612 control the quantity of laser beam emission, and records the data bit streams (ci) 624, 625, and 626 of the data sub blocks at non-adjacent locations on an optical disk 620.

In this manner, the data bit streams (ci) 624, 625, and 626 of the data sub blocks divided from the data block are simultaneously recorded with optical heads, thereby achieving high-speed recording. If the recording is performed with two heads, for example, the recording speed can be twice as high as the recording speed achieved with one head.

Next, a second embodiment of the present invention is described.

Figure 7:
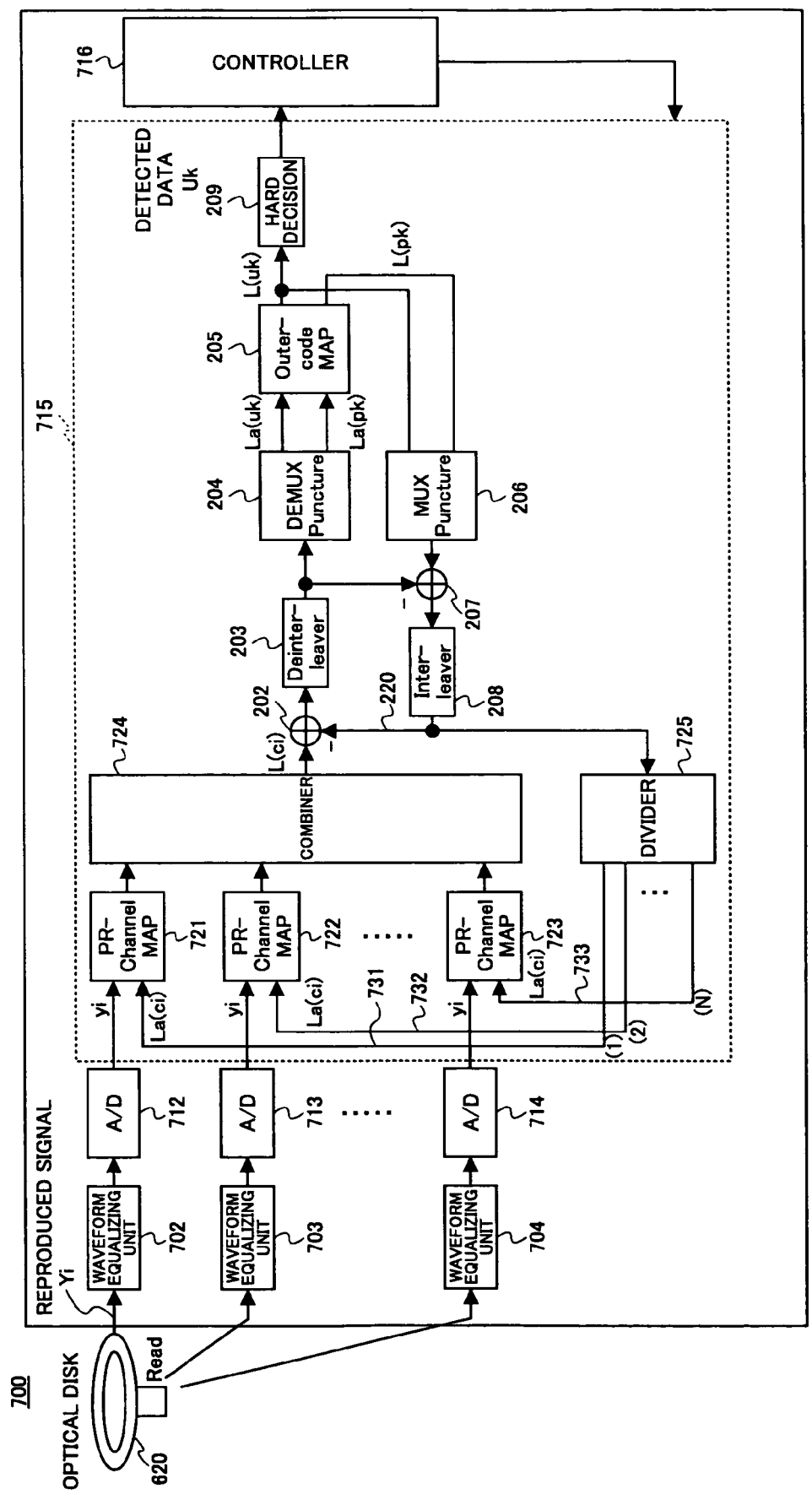
FIG. 7 is a block diagram of an optical disk reproducing system that utilizes a parallel processing and iterative decoding technique in accordance with the present invention.

FIG. 7 is a block diagram of an optical disk reproducing system that utilizes the parallel processing and iterative decoding technique of the present invention.

The reproducing system 701 of a data recording and reproducing device 700 shown in FIG. 7 includes an optical disk 620, waveform equalizing units 702, 703, and 704, A/D converters 712, 713, and 714, an iterative decoder 715, and a controller 716. Each of the waveform equalizing units 702, 703, and 704 includes the amplifier, the AGC (Auto Gain Controller), the low pass filter, and the waveform equalizer shown in FIG. 1.

Figure 2:
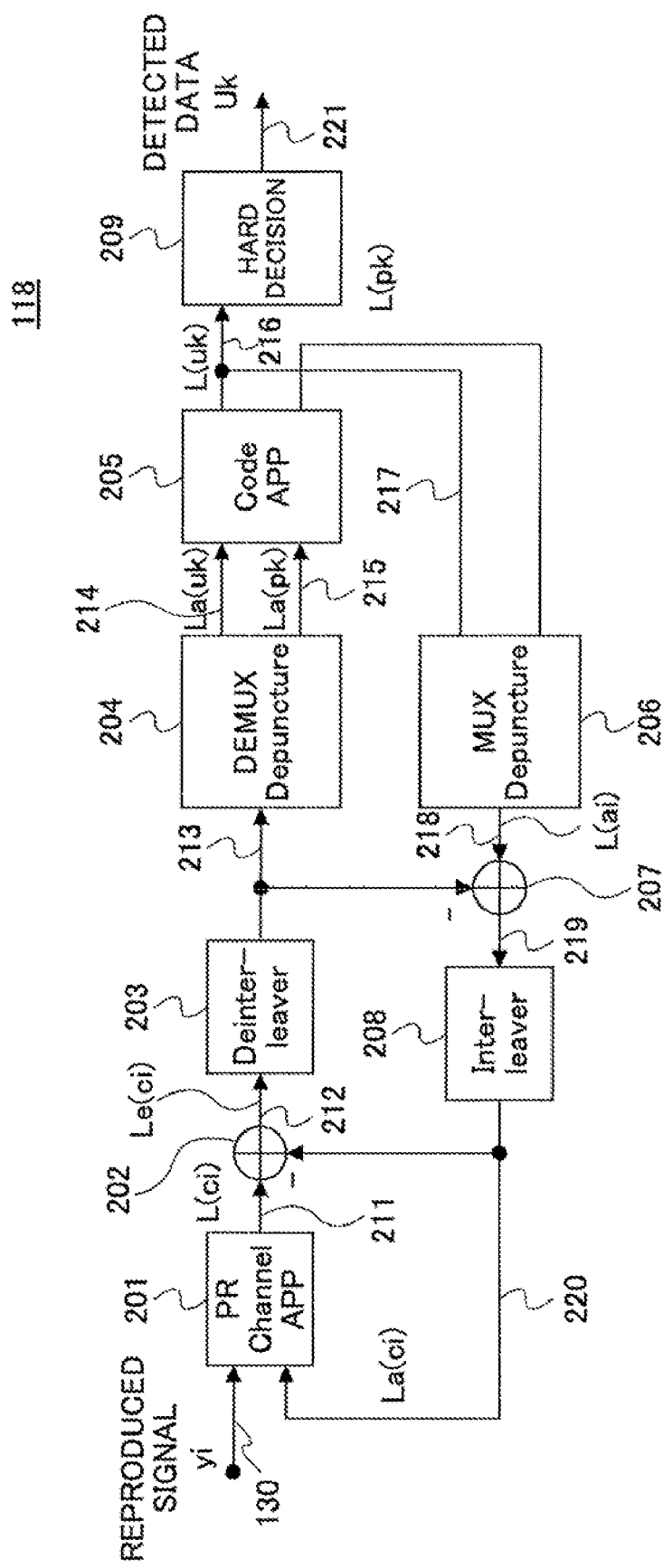
FIG. 2 illustrates an example structure of the iterative decoder of the reproducing system of the prior art.
Figure 3:
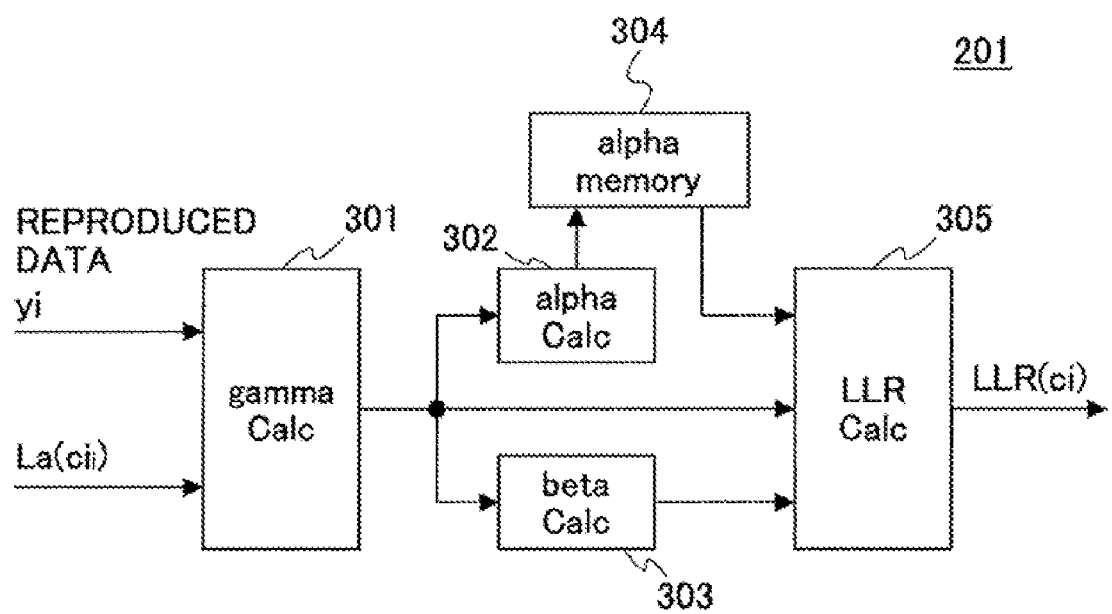
FIG. 3 is a block diagram of the PR channel decoder of the iterative decoder of FIG. 2.

In FIG. 7, the same components denoted by the same reference numerals as those in FIG. 2 indicate the same components as those shown in FIG. 2. The iterative decoder 715 includes PR channel decoders 721, 722, and 723, a combiner 724, a divider 725, a subtractor 202, a deinterleaver 203, a DEMUX and depuncture unit 204, an outer code decoder 205, a MUX and puncture unit 206, a subtractor 207, an interleaver 208, and a hard decision unit 209.

The operation of the reproducing system 701 of the data recording and reproducing device 700 shown in FIG. 7 is described below.

First, signals are reproduced in parallel from recording locations on the optical disk 620 with optical heads.

The reproduced signals are input to the respective waveform equalizing units 702, 703, and 704, which then perform waveform equalization. If signals are recorded on the optical disk 620 at such a high density as to cause intersymbol interference, each of the waveform equalizing units 702, 703, and 704 can equalize the reproduced signals from the optical disk 620 to a PR waveform (a partial response waveform), as the PR channel 111 of FIG. 1 does. In short, the signals that are output from the respective waveform equalizing units 702, 703, and 704 can be considered to have been encoded through a PR channel.

The output signals that have been encoded through a PR channel and output from the respective waveform equalizing units 702, 703, and 704 are then supplied to the respective A/D converters 712, 713, and 714. The respective A/D converters 712, 713, and 714 convert the signals, which have been encoded through the PR channel, into digital signals.

The digital signals converted by the respective A/D converters 712, 713, and 714 are then supplied to the respective PR channel decoders 721, 722, and 723 that perform MAP decoding. The reproduced signals that are input to the respective PR channel decoders 721, 722, and 723 are signals reproduced from the respective data sub blocks obtained by dividing a data block. Accordingly, the respective PR channel decoders 721, 722, and 723 perform likelihood calculation with respect to the reproduced signals of the respective data sub blocks.

The length of each of the data sub blocks is shorter than the length of the original data block, as shown in FIG. 4B. Therefore, the amount of data to be stored when the respective PR channel decoders 721, 722, and 723 perform the likelihood calculation is small. Accordingly, the size of the memory that is provided in each of the PR channel decoders 721, 722, and 723 is also small.

The likelihood information as to the data sub blocks that are decoded by the respective PR channel decoders 721, 722, and 723 are then input to the combiner 724.

The combiner 724 combines the likelihood information of all the data sub blocks that are output from the PR channel decoders 721, 722, and 723, so as to form likelihood information as to the single original data block in accordance with the recording format that is used for recording the data block as the divided data sub blocks on the optical disk 620. The combiner 724 then outputs the combined likelihood information with respect to the original data block.

The combined likelihood information as to the original data block that is output from the combiner 724 is then input to the subtractor 202. The operations of the subtractor 202, the deinterleaver 203, the DEMUX and depuncture unit 204, the outer code decoder 205, the MUX and puncture unit 206, the subtractor 207, the interleaver 208, and the hard decision unit 209 are the same as the operations of the components denoted by like reference numerals in FIG. 2.

When iterative decoding is to be performed, the output of the interleaver 208 is supplied to the divider 725. The divider 725 divides priori information 220 into information pieces having the sizes corresponding to the respective sizes of the data sub blocks. The priori information 220 is output from the interleaver 208 and is based on the output of the outer code decoder 205. The divider 725 supplies the divisional priori information pieces 731, 732, and 733 to the PR channel decoders 721, 722, and 723, respectively. Using the divisional priori information pieces 731, 732, and 733, the respective PR channel decoders 721, 722, and 723 perform likelihood calculation.

The above described operation is repeated a predetermined number of times, so that iterative decoding can be performed at a high speed.

As described above, this embodiment can provide a data recording and reproducing device with a small circuit size that can reproduce data at a high speed from a recording medium on which data is recorded at a high density, utilizing an iterative decoding technique.

In this embodiment, one data block is divided into data sub blocks, and the data sub blocks are dispersively recorded at different locations on an optical disk. Accordingly, the data sub blocks have different influence of noise when the data sub blocks are reproduced. As a result, the number of errors caused in an iterative decoding operation varies among the data sub blocks. Thus, the error correcting ability through iterative decoding can be further improved by this embodiment, compared with the case where one data block is collectively recorded in a continuous region on an optical disk.

It should be noted that the present invention is not limited to the embodiments specifically disclosed above, but other variations and modifications may be made without departing from the scope of the present invention.

What is claimed is:

1. A data recording and reproducing device that records a data block having input data encoded with convolutional codes on a recording medium, reproduces the data block through a partial response channel, and decodes the data block from the reproduced signal, utilizing an iterative decoding technique by which the data block is decoded through iterative decoding using likelihood information, the device comprising:

a dividing unit that divides the data block encoded with the convolutional codes into a plurality of data sub blocks;

a recording unit that records the data sub blocks at non-adjacent locations on the recording medium;

a plurality of detecting units that detect the data sub blocks in parallel, the data blocks being scatteringly recorded at non-adjacent locations on the recording medium; and a plurality of PR channel decoders that calculate likelihood information as to the respective data sub blocks in parallel, the data sub blocks being detected by the respective detecting units.

2. The data recording and reproducing device as claimed in claim 1, wherein the dividing unit interleaves the data block before dividing the data block into the data sub blocks.

3. The data recording and reproducing device as claimed in claim 1, further comprising:

a combining unit that combines the likelihood information as to the respective data sub blocks, and generates likelihood information as to the data block.

4. A data recording and reproducing method by which a data block having input data encoded with convolutional codes is recorded on a recording medium, is reproduced through a partial response channel, and is decoded from the reproduced signal through an iterative decoding process using likelihood information, the method comprising the steps of:

dividing the data block encoded with the convolutional codes into a plurality of data sub blocks;

recording the data sub blocks at non-adjacent locations on the recording medium;

detecting the data sub blocks in parallel, the data sub blocks being scatteringly recorded at non-adjacent locations on the recording medium; and performing PR channel decoding to calculate likelihood information as to the respective data sub blocks in parallel, the data sub blocks being detected in the detecting step.

5. The data recording and reproducing method as claimed in claim 4, wherein the dividing step includes interleaving the data block before dividing the data block into the data sub blocks.

6. The data recording and reproducing method as claimed in claim 1, further comprising the step of:

combining the likelihood information as to the respective data sub blocks, so as to generate likelihood information as to the data block.

* * * * *